United States Patent
Hoch et al.

(10) Patent No.: US 11,056,633 B2
(45) Date of Patent: Jul. 6, 2021

(54) RATIONAL METHOD FOR THE POWDER METALLURGICAL PRODUCTION OF THERMOELECTRIC COMPONENTS

(71) Applicant: Evonik Operations GmbH, Essen (DE)

(72) Inventors: Sascha Hoch, Bochum (DE); Magdalena Kern, Alzenau (DE); Patrik Stenner, Hanau (DE); Jens Busse, Bochum (DE); Mareike Giesseler, Maintal (DE); Wolfgang Deis, Heidelberg (DE); Zeljko Rajic, Waiblingen (DE)

(73) Assignee: Evonik Operations GmbH, Essen (DE)

( * ) Notice: Subject to any disclaimer, the term of this patent is extended or adjusted under 35 U.S.C. 154(b) by 389 days.

(21) Appl. No.: 16/069,310

(22) PCT Filed: Jan. 6, 2017

(86) PCT No.: PCT/EP2017/050248
§ 371 (c)(1),
(2) Date: Jul. 11, 2018

(87) PCT Pub. No.: WO2017/125268
PCT Pub. Date: Jul. 27, 2017

(65) Prior Publication Data
US 2018/0358536 A1     Dec. 13, 2018

(30) Foreign Application Priority Data
Jan. 21, 2016   (EP) .................... 16152219

(51) Int. Cl.
| | |
|---|---|
| H01L 35/34 | (2006.01) |
| B22F 3/105 | (2006.01) |
| B22F 3/14 | (2006.01) |
| B22F 7/08 | (2006.01) |

(52) U.S. Cl.
CPC .............. *H01L 35/34* (2013.01); *B22F 3/105* (2013.01); *B22F 3/14* (2013.01); *B22F 7/08* (2013.01);
(Continued)

(58) Field of Classification Search
CPC ......... H01L 35/00; H01L 35/02; H01L 35/04; H01L 35/08; H01L 35/12; H01L 35/14;
(Continued)

(56) References Cited

U.S. PATENT DOCUMENTS

| | | | |
|---|---|---|---|
| 2,519,785 A | 8/1950 | Okolicsanyi | |
| 3,008,300 A | 11/1961 | Ryan et al. | |

(Continued)

FOREIGN PATENT DOCUMENTS

| | | |
|---|---|---|
| CH | 401 186 | 4/1966 |
| CN | 1755961 | 4/2006 |

(Continued)

OTHER PUBLICATIONS

"E.W. Washburn, International Critical Tables of Numerical Data, Physics, Chemistry and Technology, 2003, 1st Electronic Edition, 111" (Year: 2003).*

(Continued)

*Primary Examiner* — Vanessa T. Luk
(74) *Attorney, Agent, or Firm* — Grüneberg and Myers PLLC

(57) ABSTRACT

A method can produce a thermoelectric component or at least a semifinished version of the thermoelectric component. The method includes: a) providing a substantially planar substrate; b) providing a pulverulent thermoelectrically active material; c) pressing the active material to form green bodies; d) inserting green bodies into through-holes of the substrate; e) arranging the substrate with the green bodies inserted therein between two substantially planar (Continued)

Figure 1:
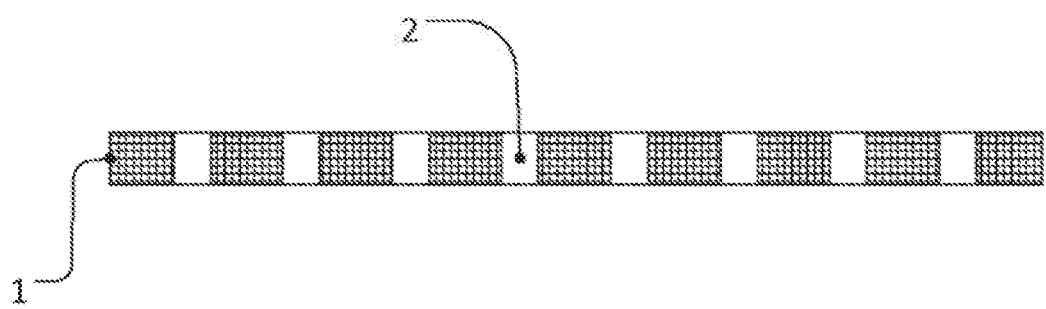

electrodes; f) contacting face ends of the green bodies with the electrodes; g) exposing the green bodies to an electric current flowing between the electrodes; h) exposing the green bodies to a pressure force acting between the electrodes; i) sintering the green bodies to form thermolegs; and k) levelling the substrate and the thermolegs accommodated therein by bringing them closer to the electrodes while maintaining the parallelity thereof.

16 Claims, 12 Drawing Sheets

(52) U.S. Cl.
CPC ... *B22F 2003/1051* (2013.01); *B22F 2302/45* (2013.01); *B22F 2998/10* (2013.01)

(58) Field of Classification Search
CPC ......... H01L 35/24; H01L 35/28; H01L 35/32; H01L 35/34; H01L 2224/16225; H01L 27/16; B22F 3/12; B22F 3/14; B22F 3/105; B22F 7/08; B22F 3/10; B22F 3/1017; B22F 3/1021; B22F 3/1025; B22F 3/1028; B22F 3/1208; B22F 3/1216; B22F 3/1225; B22F 3/1233; B22F 3/1241; B22F 3/125; B22F 3/1258; B22F 3/1266; B22F 3/1275; B22F 3/1283; B22F 3/1291; B22F 3/15; B22F 3/156; B22F 3/16; B22F 3/162; B22F 3/164; B22F 3/168; B22F 2003/1042; B22F 2003/1046; B22F 2003/1051; B22F 2003/1052; B22F 2003/1053; B22F 2003/1054; B22F 2003/145; B22F 2003/153; B22F 2003/166; B22F 5/006; B22F 7/06

See application file for complete search history.

(56) References Cited

U.S. PATENT DOCUMENTS

| | | | |
|---|---|---|---|
| 3,201,504 A | 8/1965 | Stevens | |
| 3,208,835 A | 9/1965 | Duncan et al. | |
| 3,269,871 A | 8/1966 | Kilp et al. | |
| 3,356,539 A | 12/1967 | Stachurski | |
| 3,520,656 A * | 7/1970 | Yates | C01B 32/984 423/345 |
| 3,726,100 A * | 4/1973 | Widakowich | F25B 21/02 62/3.2 |
| 3,909,241 A | 9/1975 | Cheney et al. | |
| 4,032,371 A | 6/1977 | Andersen | |
| 4,149,025 A | 4/1979 | Niculescu | |
| 4,320,251 A | 3/1982 | Narasimhan et al. | |
| 4,395,279 A | 7/1983 | Houck | |
| 4,513,201 A | 4/1985 | Falk | |
| 4,529,532 A | 7/1985 | Gliem et al. | |
| 4,654,224 A | 3/1987 | Allred et al. | |
| 5,139,624 A | 8/1992 | Searson et al. | |
| 5,168,339 A | 12/1992 | Yokotani et al. | |
| 5,411,599 A | 5/1995 | Horn et al. | |
| 5,705,434 A | 1/1998 | Imanishi et al. | |
| 5,750,000 A | 5/1998 | Yonehara et al. | |
| 5,856,210 A | 1/1999 | Leavitt et al. | |
| 5,911,102 A * | 6/1999 | Takahashi | B22F 3/10 419/38 |
| 6,005,182 A | 12/1999 | Imanishi et al. | |
| 6,025,554 A | 2/2000 | Macris | |
| 6,127,619 A | 10/2000 | Xi et al. | |
| 6,225,548 B1 | 5/2001 | Sakakibara et al. | |
| 6,297,441 B1 * | 10/2001 | Macris | H01L 35/32 136/201 |
| 6,300,150 B1 | 10/2001 | Venkatasubramanian | |
| 6,326,279 B1 | 12/2001 | Kakizaki et al. | |
| 6,519,947 B1 | 2/2003 | Bass et al. | |
| 6,872,879 B1 | 3/2005 | Serras et al. | |
| 8,378,206 B2 | 2/2013 | Schuette et al. | |
| 9,530,952 B2 | 12/2016 | Stenner et al. | |
| 9,553,249 B2 | 1/2017 | Busse et al. | |
| 10,006,130 B2 | 6/2018 | Hoch et al. | |
| 2001/0052357 A1 | 12/2001 | Kajihara et al. | |
| 2002/0026856 A1 | 3/2002 | Suzuki et al. | |
| 2002/0153595 A1 | 10/2002 | Tayanaka | |
| 2003/0102554 A1 | 6/2003 | Chu et al. | |
| 2004/0025930 A1 | 2/2004 | Serras | |
| 2004/0055153 A1 | 3/2004 | Zahradnik et al. | |
| 2004/0102051 A1 | 5/2004 | Bottner et al. | |
| 2005/0042743 A1 | 2/2005 | Kawai et al. | |
| 2005/0112872 A1 | 5/2005 | Okamura et al. | |
| 2005/0140029 A1 | 6/2005 | Li et al. | |
| 2005/0257822 A1 | 11/2005 | Smith et al. | |
| 2007/0095383 A1 * | 5/2007 | Tajima | C22C 12/00 136/238 |
| 2007/0172406 A1 | 7/2007 | Pridoehl et al. | |
| 2007/0209696 A1 | 9/2007 | Duerr et al. | |
| 2007/0240749 A1 | 10/2007 | Ohtaki | |
| 2008/0029146 A1 | 2/2008 | Plissionnier et al. | |
| 2008/0121263 A1 | 5/2008 | Schutte et al. | |
| 2009/0025774 A1 | 1/2009 | Plissonnier et al. | |
| 2009/0026458 A1 | 1/2009 | Ebbers et al. | |
| 2009/0038667 A1 | 2/2009 | Hirono et al. | |
| 2009/0039547 A1 | 2/2009 | Finnah et al. | |
| 2009/0084423 A1 | 4/2009 | Horio | |
| 2009/0126771 A1 * | 5/2009 | Takahashi | H01L 35/32 136/203 |
| 2009/0152492 A1 | 6/2009 | Ohsora et al. | |
| 2009/0199887 A1 | 8/2009 | Johnson et al. | |
| 2009/0217961 A1 | 9/2009 | Chen et al. | |
| 2009/0272417 A1 | 11/2009 | Schulz-Harder | |
| 2009/0314520 A1 | 12/2009 | Süss-Wolf et al. | |
| 2010/0119770 A1 | 5/2010 | Hiroyama et al. | |
| 2010/0167444 A1 | 7/2010 | Chen et al. | |
| 2010/0221544 A1 | 9/2010 | Baumer et al. | |
| 2011/0016888 A1 | 1/2011 | Haass et al. | |
| 2011/0018155 A1 | 1/2011 | Stefan et al. | |
| 2011/0023930 A1 | 2/2011 | König et al. | |
| 2011/0089363 A1 | 4/2011 | Ito et al. | |
| 2011/0314798 A1 | 12/2011 | Limbeck et al. | |
| 2012/0159967 A1 | 6/2012 | Lee et al. | |
| 2012/0177864 A1 | 7/2012 | Limbech et al. | |
| 2012/0180842 A1 | 7/2012 | Chen et al. | |
| 2012/0247524 A1 | 10/2012 | Rolison | |
| 2012/0298163 A1 | 11/2012 | Brehm et al. | |
| 2013/0019918 A1 | 1/2013 | Boukai et al. | |
| 2013/0061901 A1 | 3/2013 | Tohei et al. | |
| 2013/0144107 A1 | 6/2013 | Phillips et al. | |
| 2013/0160807 A1 | 6/2013 | Brueck | |
| 2013/0255740 A1 | 10/2013 | Delaizir et al. | |
| 2013/0284228 A1 | 10/2013 | Toyoda et al. | |
| 2014/0026934 A1 | 1/2014 | Xu et al. | |
| 2014/0060605 A1 | 3/2014 | Angermann et al. | |
| 2014/0140881 A1 * | 5/2014 | Iversen | H01L 35/18 419/32 |
| 2014/0190543 A1 | 7/2014 | Chen | |
| 2014/0230870 A1 | 8/2014 | Kondo | |
| 2014/0246067 A1 | 9/2014 | Hoppe | |
| 2015/0047685 A1 | 2/2015 | Stenner et al. | |
| 2015/0068915 A1 | 3/2015 | Hoch et al. | |
| 2015/0144171 A1 | 5/2015 | Taniguchi et al. | |
| 2016/0240763 A1 | 8/2016 | Busse et al. | |
| 2017/0218494 A1 | 8/2017 | Busse et al. | |
| 2017/0253464 A1 * | 9/2017 | Molteni | B66C 1/04 |
| 2018/0358536 A1 | 12/2018 | Hoch et al. | |

FOREIGN PATENT DOCUMENTS

| | | |
|---|---|---|
| CN | 101395730 | 3/2009 |
| CN | 101409324 | 4/2009 |
| CN | 103460420 | 12/2013 |
| DE | 3604546 | 8/1986 |
| DE | 100 38 891 | 2/2002 |
| DE | 102 31 445 | 1/2004 |
| DE | 102 41 786 | 3/2004 |

(56) References Cited

FOREIGN PATENT DOCUMENTS

| | | | | |
|---|---|---|---|---|
| DE | 10 2004 032 569 | | 1/2005 | |
| DE | 10 2005 056 446 | | 11/2006 | |
| DE | 10 2006 039 024 | | 2/2008 | |
| DE | 10 2007 039 060 | | 2/2009 | |
| DE | 10 2009 025 032 | | 12/2010 | |
| DE | 10 2012 017 556 | | 3/2013 | |
| DE | 10 2012 205 087 | | 10/2013 | |
| DE | 102012205087 | A1 * | 10/2013 | ............ H01L 35/34 |
| DE | 10 2012 018 387 | | 3/2014 | |
| DE | 10 2014 203 052 | | 8/2014 | |
| EP | 0 117 743 | | 9/1984 | |
| EP | 0 773 592 | | 5/1997 | |
| EP | 0 880 184 | | 11/1998 | |
| EP | 1 083 610 | | 3/2001 | |
| EP | 2 136 416 | | 12/2009 | |
| GB | 1013265 | | 12/1965 | |
| GB | 1118183 | | 6/1968 | |
| JP | H4-3475 | | 1/1992 | |
| JP | H7-231121 | | 8/1995 | |
| JP | H8-153899 | | 6/1996 | |
| JP | H10-9969 | | 1/1998 | |
| JP | H10-242535 | | 9/1998 | |
| JP | H11-163424 | | 6/1999 | |
| JP | H11-317547 | | 11/1999 | |
| JP | H11-317548 | | 11/1999 | |
| JP | 2001-194022 | | 7/2001 | |
| JP | 2002-076451 | | 3/2002 | |
| JP | 2002-76451 | | 3/2002 | |
| JP | 2002-111085 | | 4/2002 | |
| JP | 2002-270912 | | 9/2002 | |
| JP | 2003-332644 | | 11/2003 | |
| JP | 2004-265988 | | 9/2004 | |
| JP | 2005-223140 | | 8/2005 | |
| JP | 2005-286228 | | 10/2005 | |
| JP | 2006-32620 | | 2/2006 | |
| JP | 2006-32723 | | 2/2006 | |
| JP | 2006-32850 | | 2/2006 | |
| JP | 2006-339494 | | 12/2006 | |
| JP | 2007-173852 | | 7/2007 | |
| JP | 2008-186977 | | 8/2008 | |
| JP | 2008-212976 | | 9/2008 | |
| JP | 2010-157645 | | 7/2010 | |
| JP | 2011-29295 | | 2/2011 | |
| JP | 2013-102002 | | 5/2013 | |
| JP | 2013-545298 | | 12/2013 | |
| JP | 2015-518650 | | 7/2015 | |
| SU | 219646 | | 6/1968 | |
| WO | 97/44993 | | 11/1997 | |
| WO | 99/63791 | | 12/1999 | |
| WO | 99/65086 | | 12/1999 | |
| WO | 00/30808 | | 6/2000 | |
| WO | 01/69657 | | 9/2001 | |
| WO | 2005/031026 | | 4/2005 | |
| WO | 2008/061823 | | 5/2008 | |
| WO | 2009/023776 | | 2/2009 | |
| WO | 2011/047405 | | 4/2011 | |
| WO | 2012/056411 | | 5/2012 | |
| WO | 2012/120060 | | 9/2012 | |
| WO | 2013/060648 | | 5/2013 | |
| WO | 2013/109729 | | 7/2013 | |
| WO | 2013/144106 | | 10/2013 | |
| WO | 2013/144107 | | 10/2013 | |
| WO | 2013/165938 | | 11/2013 | |
| WO | 2013/179840 | | 12/2013 | |
| WO | 2014/016323 | | 1/2014 | |
| WO | 2015/043824 | | 4/2015 | |
| WO | 2015/124343 | | 8/2015 | |

OTHER PUBLICATIONS

"Center for Chemical Process Safety, Guidelines for Safe Handling of Powders and Bulk Solids, 2005, Center for Chemical Process Safety/AIChE, 730-733" (Year: 2005).*

"P. Anandan, Tailoring bismuth telluride nanostructures using a scalable sintering process and their thermoelectric properties, 2014, The Royal Society of Chemistry, 2014, 7956-7962" (Year: 2014).*

Chen et al., "Dispenser Printed Thermoelectric Energy Generators," Poster, presented on BWRC, Berkeley Manufacturing Micro Integration Microfabrication Institute, Jan. 10, 2010.

Harris et al., "Thermal Conductivity Reduction of SiGe Nanocomposites," Mat. Res. Soc. Symp. Proc., vol. 793, Materials Research Society, 6 pp., 2004.

Klingshirn et al., "Zinkoxid—ein alter, neuer Halbleiter," Physik Journal 5, No. 1, pp. 33-39, 2006, (with English translation).

Lechner et al., "Thermoelectric effect in laser annealed printed nanocrystalline silicon layers," Phys. Stat. Sol. (RRL) 1, No. 6, pp. 262-264, 2007. DOI:10.1002/pssr.200701198.

Madan et al., "High-Performance Dispenser Printed MA p-Type $Bi_{0.5}Sb_{1.5}Te_3$ Flexible Thermoelectric Generators for Powering Wireless Sensor Networks," ACS Appl. Mater. Interfaces, 5, 11872-11876, 2013.

Sommerlatte et al, "Thermoelektrische Multitalente," Physik Journal 6, No. 5, pp. 35-41, 2007 (with English translation).

Sun et al., "Solution-Processed Zinc Oxide Field-Effect Transistors Based on Self-Assembly of Colloidal Nanorods," Nano Letters, vol. 5, No. 12, pp. 2408-2413, 2005.

Talapin et al., "PbSe Nanocrystal Solids for n- and p-Channel Thin Film Field-Effect Transistors," Science, vol. 310, pp. 86-89, Oct. 7, 2005.

Wiggers et al., "Silicon Particle Formation by Pyrolysis of Silane in a Hot Wall Gasphase Reactor," Chem. Eng. Technol. 24, 3, pp. 261-264, 2001.

Wikipedia, "Sphärizität (Geologie)," Mar. 31, 2013 (with English translation), 7 pages.

U.S. Appl. No. 15/515,172, filed Aug. 3, 2017, 2017/0218494, Busse et al.

International Search Report mailed in PCT/EP2017/050248 dated Feb. 2, 2017.

Written Opinion of the International Search Report mailed in PCT/EP2017/050248 dated Feb. 2, 2017.

Office Action dated Jul. 14, 2020 in Indian Patent Application No. 201837031028, bilingual with English, 5 pages.

* cited by examiner

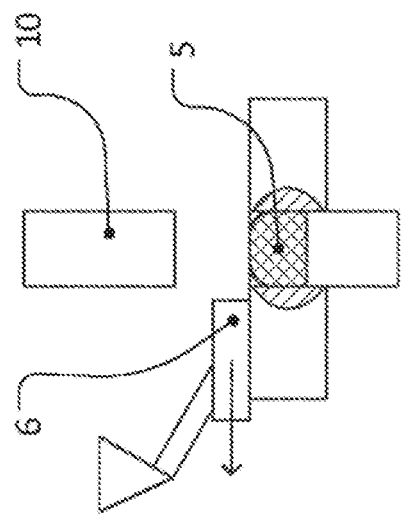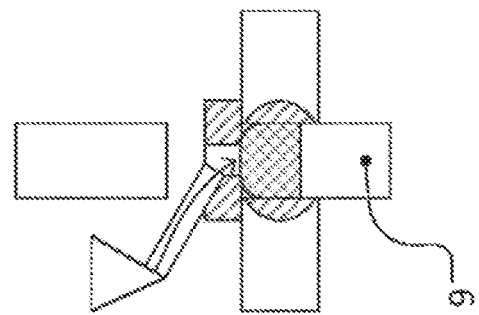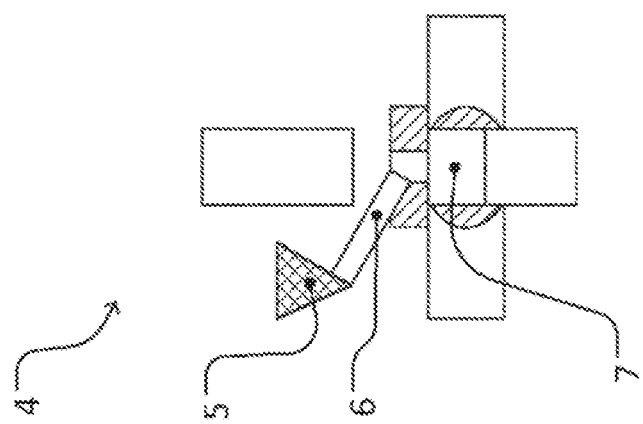

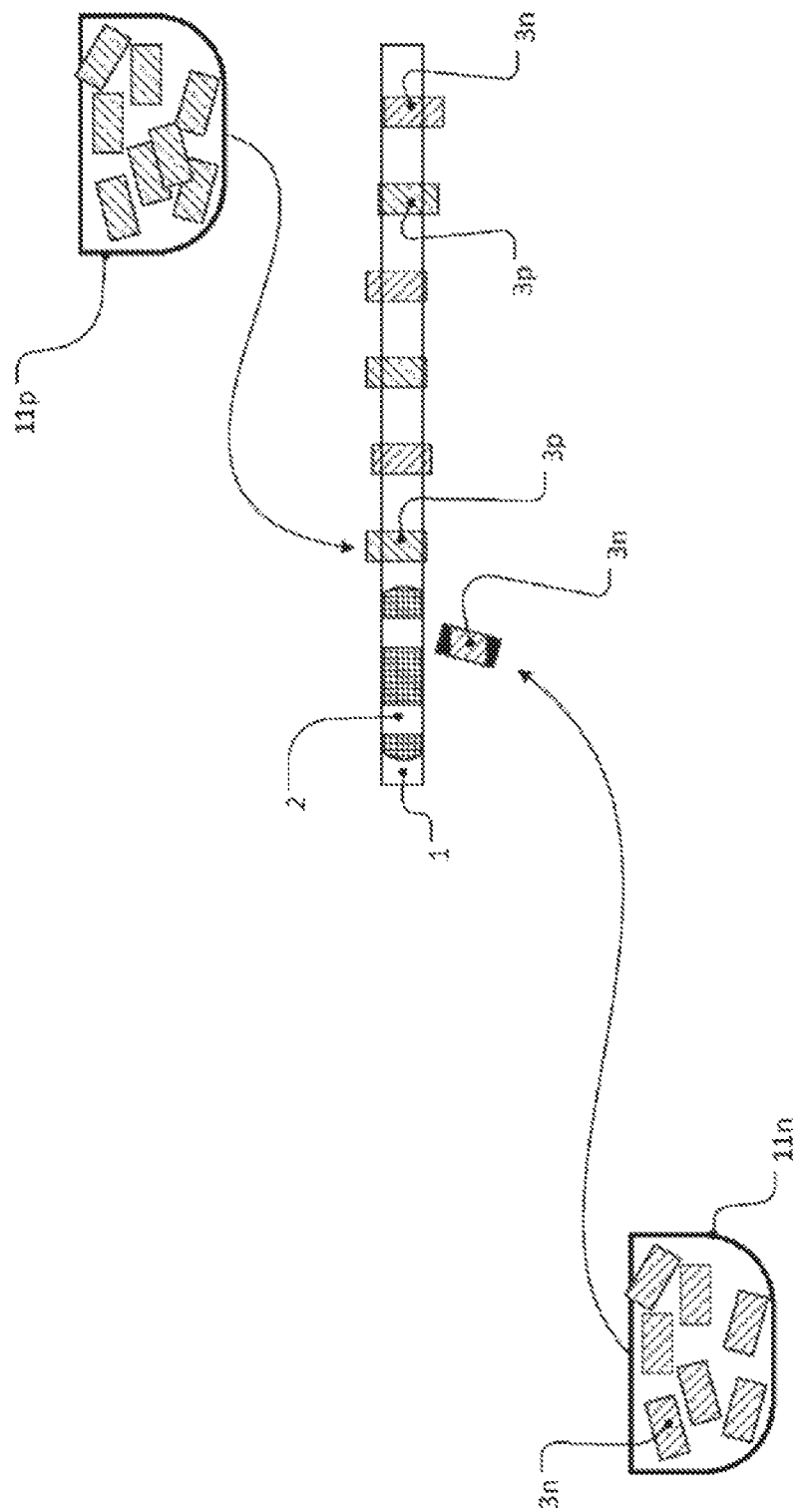

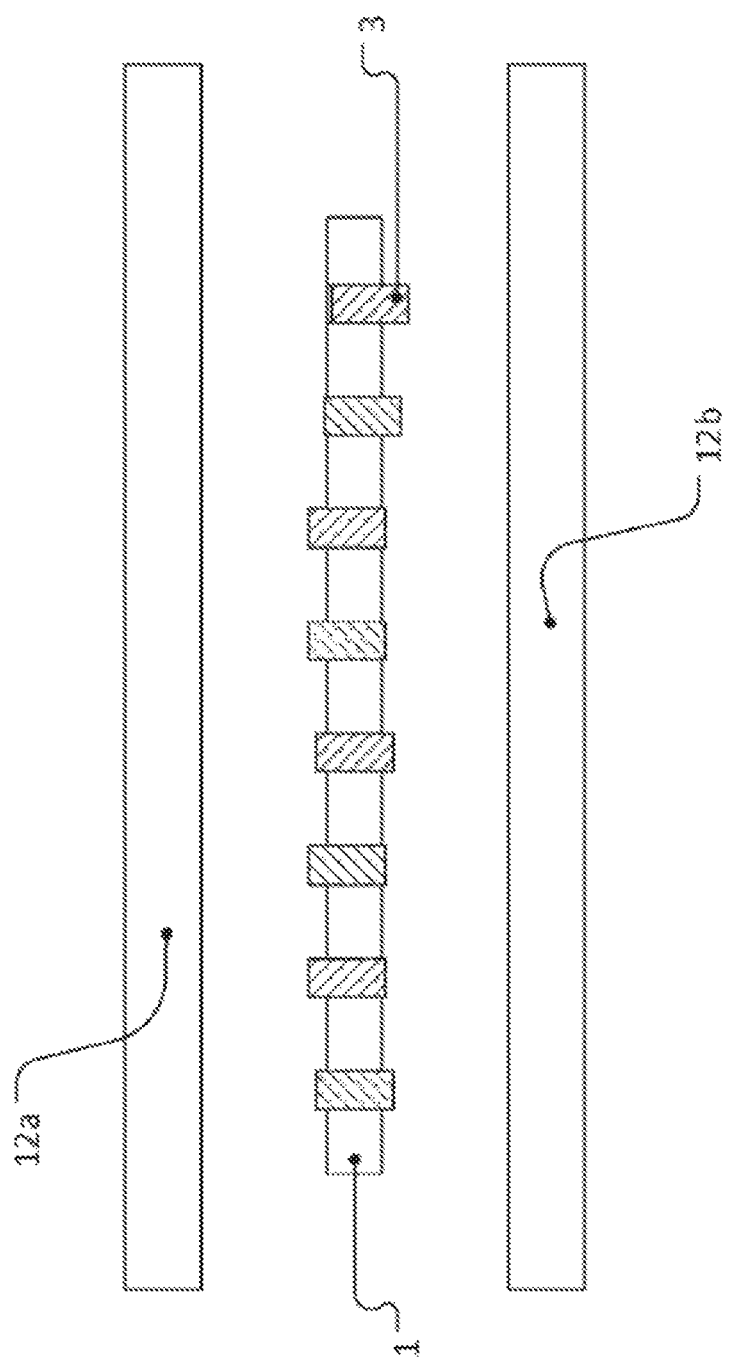

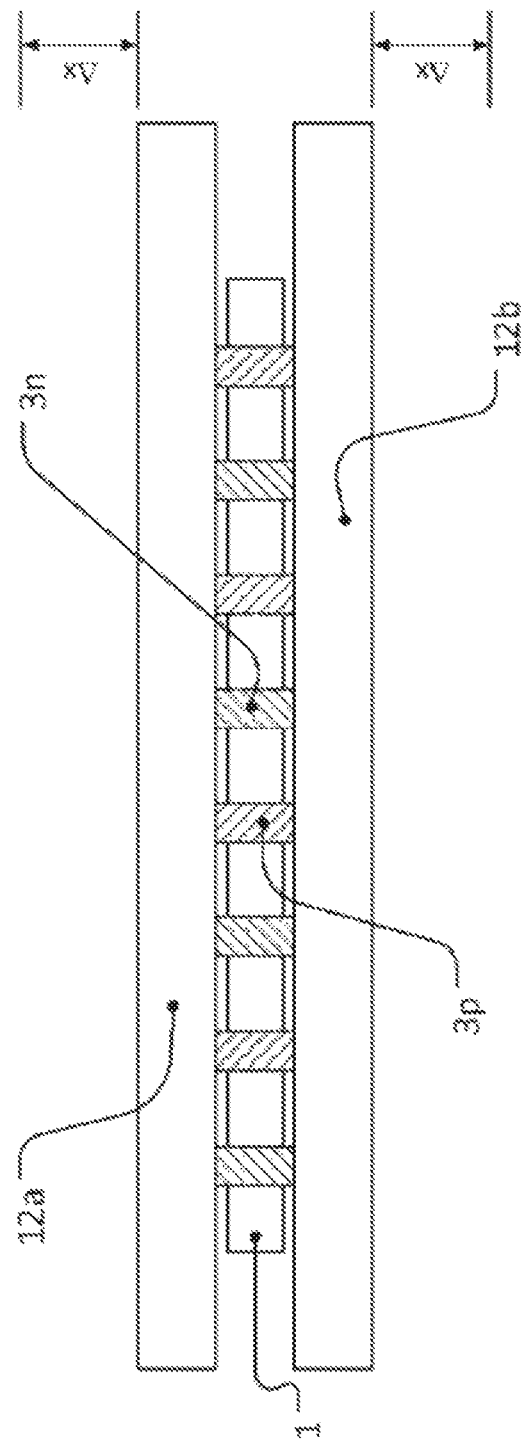

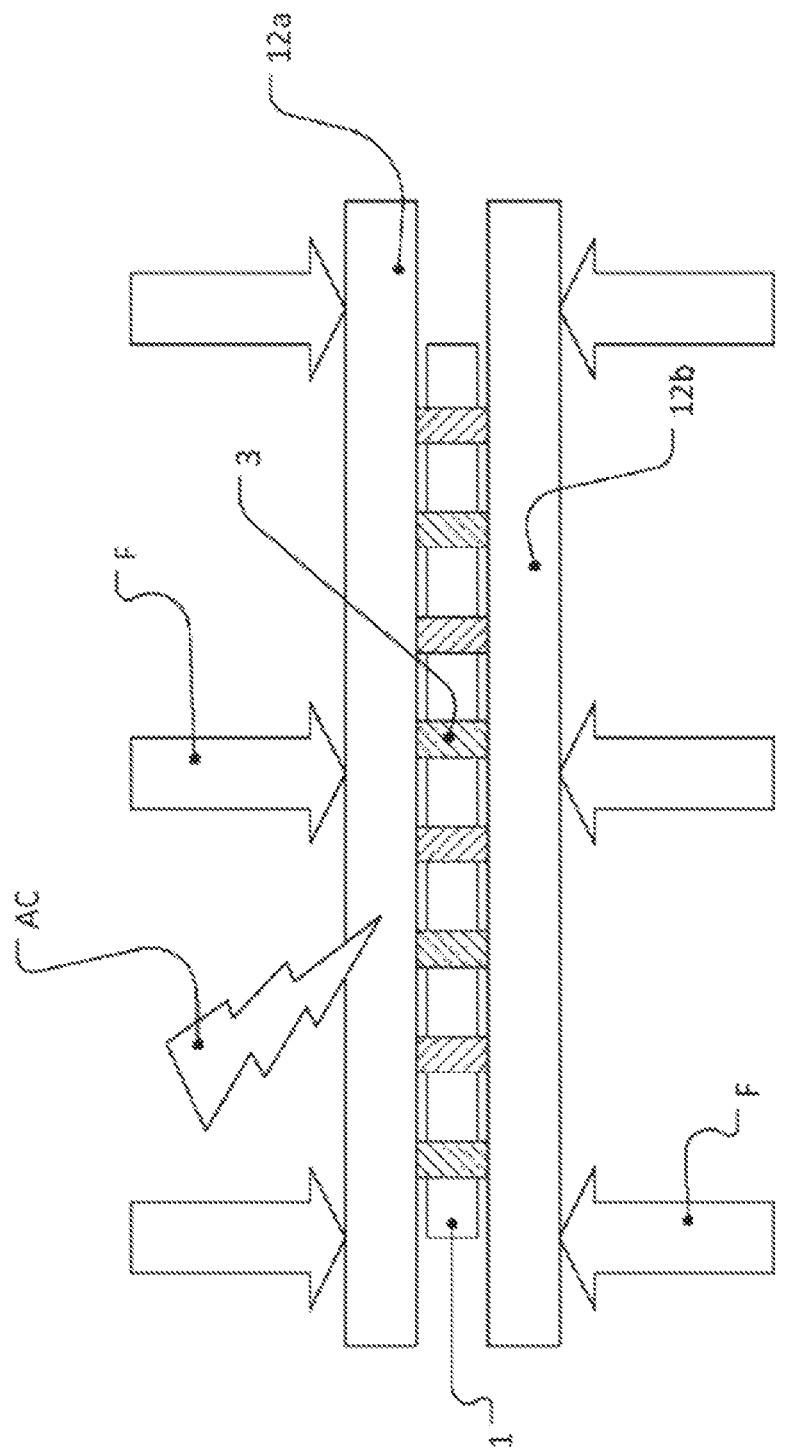

RATIONAL METHOD FOR THE POWDER METALLURGICAL PRODUCTION OF THERMOELECTRIC COMPONENTS

This application is a National Stage entry under § 371 of International Application No. PCT/EP2017/050248, filed on Jan. 6, 2017, and claims priority to European Patent Application No. 16152219.8, filed on Jan. 21, 2016.

The invention relates to a method for the powder-metallurgical production of a thermoelectric component or at least a semifinished version of the same.

A thermoelectric component is an energy transducer which converts thermal energy to electrical energy, exploiting the thermoelectric effect described by Peltier and Seebeck. Since the thermoelectric effect is reversible, any thermoelectric component can also be used for conversion of electrical energy to thermal energy: elements known as Peltier elements are used for cooling or heating objects while consuming electrical power. Peltier elements are therefore also regarded as thermoelectric components in the context of the invention. Thermoelectric components, which serve for conversion of thermal energy to electrical energy, are often referred to as thermoelectric fgenerators (TEGs).

Industrial executions of thermoelectric components comprise at least one thermocouple of thermoelectrically active material, formed from two thermolegs, and a shell which bears and surrounds and electrically insulates the thermocouple from the outside.

A multiplicity of thermoelectrically active materials are described in the literature. For commercial use, for example alloys of the class of semiconductive bismuth tellurides (in particular with additional fractions of selenium and/or antimony) are suitable, from which—doped, firstly so as to be p-conducting and secondly n-conducting—a thermocouple may be built up.

Further thermoelectrically active substance classes are: Semi-Heusler materials, various silicides (in particular magnesium, iron), various tellurides (lead, tin, lanthanum, antimony, silver), skutterudite, various antimonides (zinc, cerium, iron, ytterbium, manganese, cobalt, bismuth, occasionally also termed Zintl phases), TAGS, silicon germanides, clathrates (in particular based on germanium). As well as these semiconductor materials, thermoelectric components can also be produced from combinations of most standard metals, as is the case, for example, for conventional thermocouples for temperature measurement, e.g. Ni—CrNi. The achievable "figures of merit" (thermoelectric "degrees of efficiency") are however markedly lower than with the cited semiconductor materials.

Conventional thermoelectric components conventionally consist of solid blocks of thermoelectrically active semiconductors and hard, usually ceramic, electrically insulating casings. Where solid blocks are used, these are usually sawed out of solid ingots.

Since ingots frequently contain defects or shrinkage holes, it is customary first to grind them to powder and to sinter the powder to form a highly compacted wafer as required. Then, block-type TE legs are sawed out of the compact low-cavity wafer as required.

WO 2008061823 A1 discloses production of a semifinished version of a thermoelectric component by introducing thermoelectric material as a powder into a flat porous substrate. The thermolegs of the component produced extend perpendicular to the substrate plane.

A further powder-metallurgical method for production of thermoelectric components is disclosed by DE102012205087A1. Pressing of the active material provided in pulverulent form takes place within the holes of a perforated template, which becomes part of the produced thermoelectric component, namely the substrate.

The drawback of this method can be considered to be that this template must necessarily consist of a thermally and electrically insulating material since it remains in the TEG as substrate. At the same time, the template must withstand high mechanical loads during pressing of the green bodies, which restricts the choice of the thermally and electrically insulating substrate material.

An improved method for the powder-metallurgical production of thermoelectric components is disclosed by WO2015/043824A1. In this method, the pulverulent active material is pressed in a mould arranged outside the substrate to form green bodies, the green bodies are forced out of the mould into holes provided in the substrate and therein are sintered to form thermolegs.

A disadvantage of this method is that the mould that is arranged outside the substrate and in which the active material is pressed to form the green bodies must be arranged to align with the holes of the substrate into which the green bodies are forced. This orientation and the transfer of the green bodies from the mould into the substrate requires a special machine which must be developed and produced separately for this purpose. This considerably increases the capital cost of an assembly line that produces using this method. Furthermore, the green bodies are subject to sinter shrinkage, that is to say a reduction in volume in the course of the sintering operation. As a result, the thermolegs shorten within the substrate, whereby they may be contacted only with difficulty. Generally, protruding substrate material must be ground down in order to achieve a flush finish of the thermolegs with the surface of the substrate, which is a prerequisite for a reliable electrical contact. This process step increases the fabrication costs.

A further fundamental disadvantage of the method described in WO2015/043824A1 is that it does not permit individual weight control of the legs. This makes maintaining narrow specification limits of the homogeneity of the leg density more difficult.

Proceeding from this prior art, the object of the invention is to specify a powder-based method for production of a thermoelectric component or of a corresponding semifinished version, which can be carried out using standardized machines in order to reduce capital costs and to increase process stability. In addition, post-processing steps for equalizing substrate and thermolegs are ideally to be avoided. To facilitate quality assurance, a weight control of the individual thermolegs and/or their green bodies shall be possible.

This object is achieved by a process having the following steps:
a) providing a substantially planar substrate made of an electrically and thermally insulating substrate material, through which through-holes extend oriented substantially perpendicularly to the substrate plane;
b) providing pulverulent thermoelectrically active active material;
c) pressing the active material to form green bodies, wherein the pressing proceeds in a mould different from the substrate;
d) inserting the green bodies into the through-holes of the substrate in such a manner that, within each through-hole, along the axis thereof, one green body extends through the substrate;
e) arranging the substrate with the green bodies inserted therein between two substantially planar electrodes, in such a manner that both electrodes and the substrate are substantially orientated parallel to one another;

f) contacting face ends of the green bodies with the electrodes in such a manner that a connection is provided between the two electrodes via the green bodies, which connection transmits not only an electrical current but also a mechanical pressing force;

g) exposing the green bodies to an electric current flowing between the electrodes in such a manner that heat is evoked within the thermoelectric active material;

h) exposing the green bodies to a pressure force acting between the electrodes in such a manner that the thermoelectric active material comes under pressure;

i) sintering the green bodies to form thermolegs, with the action of pressure and heat;

k) levelling the substrate and the thermolegs accommodated therein by bringing them closer to the electrodes while maintaining the parallelity thereof, in such a manner that thermolegs finish flush with the substrate, wherein any axial offset of the green bodies in the substrate and also any sinter shrinkage are compensated for.

The invention relates to such a process.

A basic concept of the invention is to carry out the process steps of pressing, insertion and sintering on different machines in order to be able to use standardized machines for as many method operations as possible.

An essential aspect of the invention is that the sintering and equalization proceed in one working step in that planar sintering electrodes that are arranged plane-parallel to the substrate are used, which are moved towards the substrate following the sinter shrinkage. The green bodies are provided accordingly with an oversize that compensates for the sinter shrinkage. At the end of the sintering operation, the spacing between the electrodes specifies not only the substrate thickness but also the length of the thermolegs. This ensures a flush finish of the thermolegs with the substrate without further post-processing.

A further advantage of rationalization can be made accessible in that a plurality of substrates with inserted green bodies are combined to form a stack, wherein the substrates extend within the stack in parallel to one another and in each case a substantially planar separation plate is laid between two substrates that are adjacent within the stack, which separation plate extends in parallel to the substrates and which produces an electrically conductive and force-transmitting connection between the green bodies of the adjacent substrates, and in that the entire stack is arranged between the two electrodes. Using the separation plate, in one sintering operation on one sintering machine, a multiplicity of semifinished versions (that is to say substrates having inserted thermolegs) are produced.

In the above described collective method, a plurality of substrates having inserted green bodies can be arranged individually or stacked in a plane between the two electrodes. As a result, fabrication is further rationalized.

The planar electrodes and/or the separation plates preferably consist of graphite, since this substance readily conducts the electric power, withstands the high sintering temperatures and does not adhere to the thermoelectric active material. Graphite has the property that its mechanical strength increases with temperature. In order to utilize this effect, a development of the method procedure provides that the green bodies, for contacting, are exposed to a first pressing force, that then the green bodies under the action of the first pressing force are exposed to electric current until the electrodes and/or separation plates consisting of graphite have achieved a temperature at which the electrodes and/or separation plates consisting of graphite have an increased load-bearing capacity or breaking load which is above the first pressing force, and in that the green bodies are then exposed to the second pressing force, which is above the first pressing force and below the increased load-bearing capacity and/or breaking load. The second pressing force required for the pressing is therefore first established when the electrodes and/or the separation plates have, as a result of temperature, achieved a sufficient strength. Until this temperature is reached, exposure is only carried out using the first, lower pressing force.

The present method is intended for processing of thermoelectric active material which is an alloy that is selected from the class of bismuth tellurides, lead tellurides, zinc antimonides, silicides, skutterudite, semi-Häusler materials. Nanoscale silicon can likewise be used as active material. Particular preference is given to bismuth telluride ($Bi_2Te_3$).

During the pressing of the pulverulent active material to give the green bodies, the pulverulent active material is compacted. Preferably, the powder, however, is not compacted to the (theoretical) true density, but only to a first compressed density which corresponds to between 75% and 85% of the true density of the active material. The true density is taken to mean the density of an deal solid body made of the active material used. The true density of technical bismuth telluride alloys is, for example, 6.9 g/cm$^3$. Since the first compressed density is lower than the true density, the green body is porous. The first compressed density is again logically necessarily greater than the bulk density of the pulverulent active material, since the powder is compacted during pressing. The bulk density of the powder used is preferably between 30% and 50% of the true density.

In order to achieve the first compressed density, the particle size distribution of the pulverulent active material and the compression force in the tableting press must be chosen appropriately, Typically, in the event that bismuth telluride is used as active material, before the pressing, this should have a median particle size $d_{50}$ between 3 μm and 30 μm; the pressure at which the thermoelectric active material is compressed to form the green bodies should then be between 541 MPa and 955 MPa. The particle size distribution is determined by static laser light scattering according to Mie theory. This analytical method is specified in DIN-ISO 13320; the wet measurement is to be employed. A suitable measuring instrument is the laser light scattering spectrometer HORIBA LA 950 from Retsch Technology GmbH, Haan (Germany). The pressure which is employed by the tableting press during pressing of the powder can be read off on the tableting press. For this purpose the force is determined at the punch, for example using a load cell (extension measurement strips) and related to the punch area.

The length of the green bodies should correspond to between 105% and 150% of the thickness of the substrate in the levelled state. This means that the green bodies inserted into the substrate project out of the substrate which permits good mechanical and electrical contact with the electrodes and/or the separation plates. The sinter shrinkage then permits the thermolegs to shrink down to the substrate thickness, and so subsequent equalization is not necessary.

The temperature that is set in the green bodies during sintering should correspond to between 50% to 70% of the melting temperature of the active material, The melting temperature depends on the active material used. In the case of bismuth telluride, the melting temperature is 573° C. If an alloy from the class of bismuth tellurides is used, the optimum sintering temperature is therefore between 287° C. and 401° C., depending on the specific alloy.

The temperature can scarcely be measured in the green bodies themselves. Alternatively, during sintering, the temperature is measured using a thermometer at the electrodes. The sintering temperature is controlled by the electrical current which the green bodies are exposed to.

If bismuth tellurides are used as active material, the green bodies during sintering should be exposed to the electrical current in the following orders of magnitude:

Current density based on the cross-sectional area of the green bodies: 10 kA/m$^2$ to 100 kA/m$^2$ Exposure time: 600 s to 1100 s Input of electrical energy/initial weight of active material: 150 kJ/g to 250 kJ/g The current can be applied as alternating current with a frequency in the range from 20 Hz to 100 Hz. Alternating current with the standard grid frequency of 50 Hz or 60 Hz is suitable, It is also possible to employ direct current.

Owing to the exposure to electrical current, the electrodes and the green bodies heat up to temperatures between 300° C. to 400° C. The temperature can be measured in the electrodes and used as a control parameter. The high temperature effects the sintering of the active material. The sintered green body corresponds to the thermoleg. Since as a result of the sintering, the electrical resistance of the active materials decreases, the thermoelectric activity of the sintered legs increases in comparison with the porous green bodies.

For each thermocouple, two thermoelectric active materials conducting in a different manner are necessary, which are electrically connected to one another, wherein the first active material is, e.g. p-conducting, and the second active material is n-conducting, or vice versa, "Different" means here that the two active materials have a different Seebeck coefficient. p- and n-conductive semiconductors are particularly preferred as active materials, since the Seebeck coefficients thereof have different signs (negative for n-conductors, positive for p-conductors), and therefore the numerical difference in the Seebeck coefficients is particularly large. This increases the efficiency of the thermoelectric component.

In a first variant of this production method, both active materials are successively pressed to form the respective green bodies and used. This means that the first green bodies are produced from p-conducting material and inserted into the substrate and then the n-conducting active material is processed. The machine changeover times are thereby reduced. Of course, the n-conducting material can alternatively be processed first, followed by the p-conducting material.

A second and preferred variant, however, provides that two tableting presses are used, a first for the p-conducting active material, and a second for the n-conducting active material. The capital costs that are doubled in comparison with the first variant are rapidly paid back by reducing the changeover times: Since, within a thermoleg, n- and p-conducting materials cannot be mixed, it is absolutely necessary to clean the machine thoroughly during change of material. In particular, when complex rotary presses are used, the changeover times become very long as a result. When two machines are used, each of which must be operated in a single-variety manner, the changeover times are dispensed with and the machine service time are prolonged markedly. Furthermore, the use of dedicated presses for n-conducting and p-conducting active material causes a quality improvement, since contamination of the legs by foreign material is thoroughly excluded.

The pressing force which loads the green bodies during sintering is markedly lower than the pressure previously during pressing the powder to form the green bodies.

Preferably, the green bodies, during exposure to the pressing force acting between the electrodes are compressed to a second compressed density which corresponds to between 90% and 97% of the true density of the active material. The density of the green bodies immediately before sintering is therefore further increased, the theoretical true density (definition as above), however, is not established.

In the case of bismuth telluride, the green body should be exposed to a pressing force that leads to a pressure between 10 MPa to 50 MPa in the thermoelectric active material.

Cold graphite usually has a compressive strength of 60 MPa to 120 MPa. Therefore, graphite electrodes separation plates should first be heated to a temperature of about 300° C. before the final pressing force is applied. At this temperature, the graphite elements have reached the necessary breakage strength in order to bear the sintering pressure without damage. The heating rate for establishing the temperature should be about 50 K/min.

The green bodies used in this method may have differing geometric shapes. First, a general cylindrical shape comes into consideration. This need not necessarily be based on a circular base, it can also be elliptical, rectangular, square or hexagonal. Cylindrical green bodies are also usable that are based on a regular or irregular n-polygon. Particularly preferably, the green bodies, however, have a circular cylindrical shape.

In addition to a cylindrical shape, the green bodies can also be slightly conical. This means that the cross-sectional area decreases in an axial direction, the green body tapers. The advantage of a tapering green body is that it is firmly seated clamped in the through-hole of the substrate and does not fall out when the substrate having an inserted green body is handled. The cone angle is to be selected appropriately in such a manner that sufficient clamping force arises between substrate and inserted green body. Equally, the cone angle must not be too steep, in order not to split the substrate under a wedge action. A suitable cone angle also depends on the coefficient of friction and thereby on the material pairing.

The same effect can also be achieved by a tapering through-hole or by the green bodies being inserted into the through-holes with a radial oversize (press fit).

In order to be able to insert circular cylindrical green bodies readily into the substrate, they should each have a chamfer on the end side. This applies all the more when the green bodies have a radial oversize. Thanks to the chamfer, when the green bodies are inserted, also no material splits off (sharp edges readily break off). The green bodies are also less sensitive to damage from impacts. Finally, the risk of development of a "mushroom head" (or a "rivet formation") of the protrusion during sintering is reduced.

The green bodies can also be given a smooth surface, so that they slide readily into the holes of the substrate. The surface quality of the green bodies is predetermined by the shape, the metering quality and the pressure during pressing. Preferably, the lateral surface of the green bodies has a mean roughness value $R_a$ as specified in DIN 4766 T2 between 12 μm and 24 μm.

An important advantage of the method described here is that the green bodies can be pressed on a standardized machine outside the substrate. Surprisingly, tableting presses available off-the-peg are suitable therefor, as are used in the pharmaceutical industry to tablet pulverulent drugs. This finding is surprising, since tableting presses are intended for processing pharmaceutical formulations that differ chemically and physically significantly from thermoelectric active material. For instance, bismuth telluride has an extremely high density compared with customary drugs.

Nevertheless, tableting presses of the eccentric or rotary type without modification achieve the compression forces necessary for pressing thermoelectric active material to form green bodies and can produce large amounts of green bodies fully automatically at a high rate from the active material. Instead of being charged with drugs, the tableting press is charged with pulverulent thermoelectric active material. The punch pressing forces should be set in such a manner that the required pressing forces (700 MPa to 1200 MPa in the form of $Bi_2Te_3$) are achieved in the mould. Accordingly, high-load-bearing punches are to be selected. As a result, the complex new development of a separate machine can be bypassed by procuring an immediately available tableting press.

A suitable tableting press of the rotary type is type 1200i from Fette Compacting GmbH, Schwarzenbek (Germany). As stated above, preferably two tableting presses are procured, in order to produce n- and p-doped green bodies separately.

A further advantage of pharmaceutical tableting presses is that they are equipped from the start with precisely operating metering appliances; the active material is thereby weighed into the mould with high accuracy "out-of-the-box". The metering proceeds via a volume measurement.

A further advantage of the use of isolated green bodies produced ex situ on the tableting press is that faulty green bodies can more easily be eliminated, and the active material thereof recycled by grinding. If the green bodies are pressed in situ (that is to say in the substrate) or transferred en masse directly from the mould into the substrate, individual faultily pressed green bodies can pass into the substrate and decrease the quality of the later TEG.

A tableting press ejects the green bodies randomly. For the individual insertion of the green bodies into the substrate, a commercially available isolation and conveying appliance can be used, as are standardly used for inserting tablets into blister packages. Preferably, conveyor machines having piezo actuators are used, or oscillating conveyors. Suitable machines are available from Harro Höflinger Verpackungsmaschinen GmbH, Allmersbach im Tal, Germany. Other automatic placement machines can be used, or the green bodies are inserted manually into the substrate.

Fundamentally, the method according to the invention makes it possible to choose from a broad range of possible substrate materials. In order to increase the efficiency of the thermoelectric generator, the chosen substrate material should, in so far as is possible, be highly thermally and electrically insulating. However, the substrate material must also be available cost-effectively in order to ensure economic viability. In addition, the substrate material must have a temperature (change) stability suitable for the further fabrication pathway and the later utilization in the thermoelectrical component. There must likewise be a certain mechanical strength.

Examples of particularly economically advantageous substrate materials are composite materials constructed from inorganic raw materials and binders. The inorganic raw materials are preferably mica, perlite, phlogopite or muscovite. As binder, preferably silicone, silicone resin and/or epoxy resin is used. With these materials, it is in particular possible to laminate substrates constructed as layered materials. Most suitable as substrate are the insulating boards available under the trade names Miglasil® and Pamitherm® from von Roll AG, Switzerland. These are laminates constructed from silicone-bound muscovites. This temperature-stable insulation material may be processed outstandingly in the process according to the invention.

When using laminated substrate materials made of inorganic raw materials and binders, it is important to observe suitable machine parameters during mechanical machining in order to avoid damage to the material. Thus, in the case of cutting perforation of Pamitherm boards with solid carbide drills, a cutting rate in the range from 0.3 m/s to 1.5 m/s should be maintained. For a drill diameter of 4 mm, this means speeds of rotation of approximately 1500/min to 7500/min. The advance rate should be in the range from 50 mm/min to 250 mm/min. Use can also be made of drills and milling drills developed specially for laminates.

As an alternative to drilling, there is also the possibility of perforating the substrate without cutting, for example using a piercing punch.

The substrate is used as a planar material having a thickness between 1 mm and 10 mm. Preferably, the thickness is between 1.5 mm and 4 mm, very particularly preferably between 2 mm and 3 mm. Pamitherm® boards are offered in this layer thickness.

Figure 7:
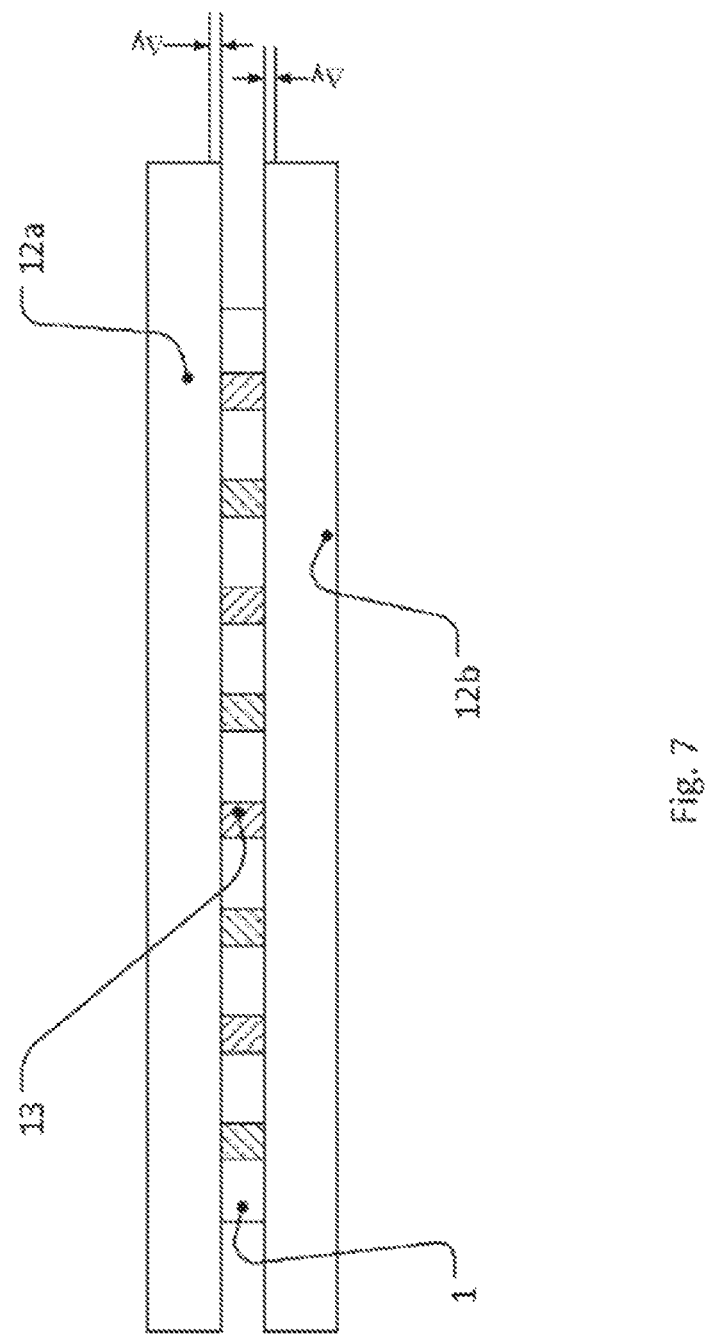
Figure 8:
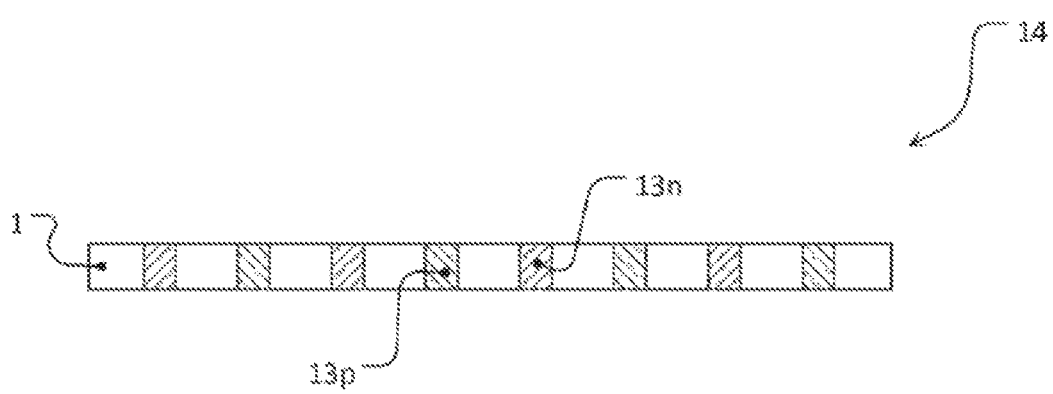
Figure 9:
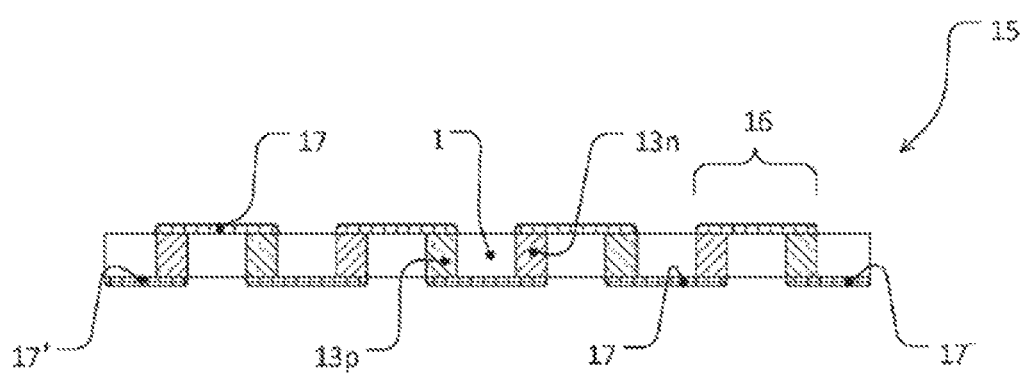
Figure 10:
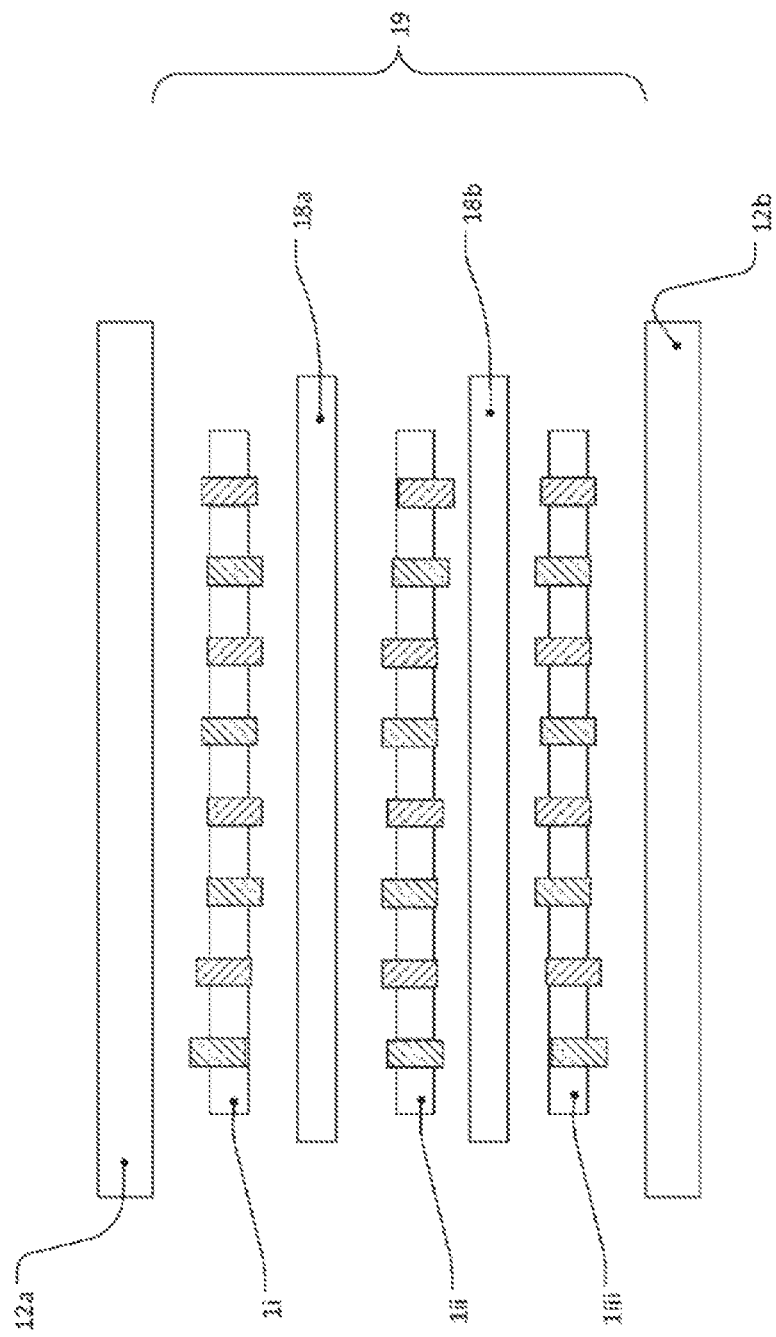
Figure 11:
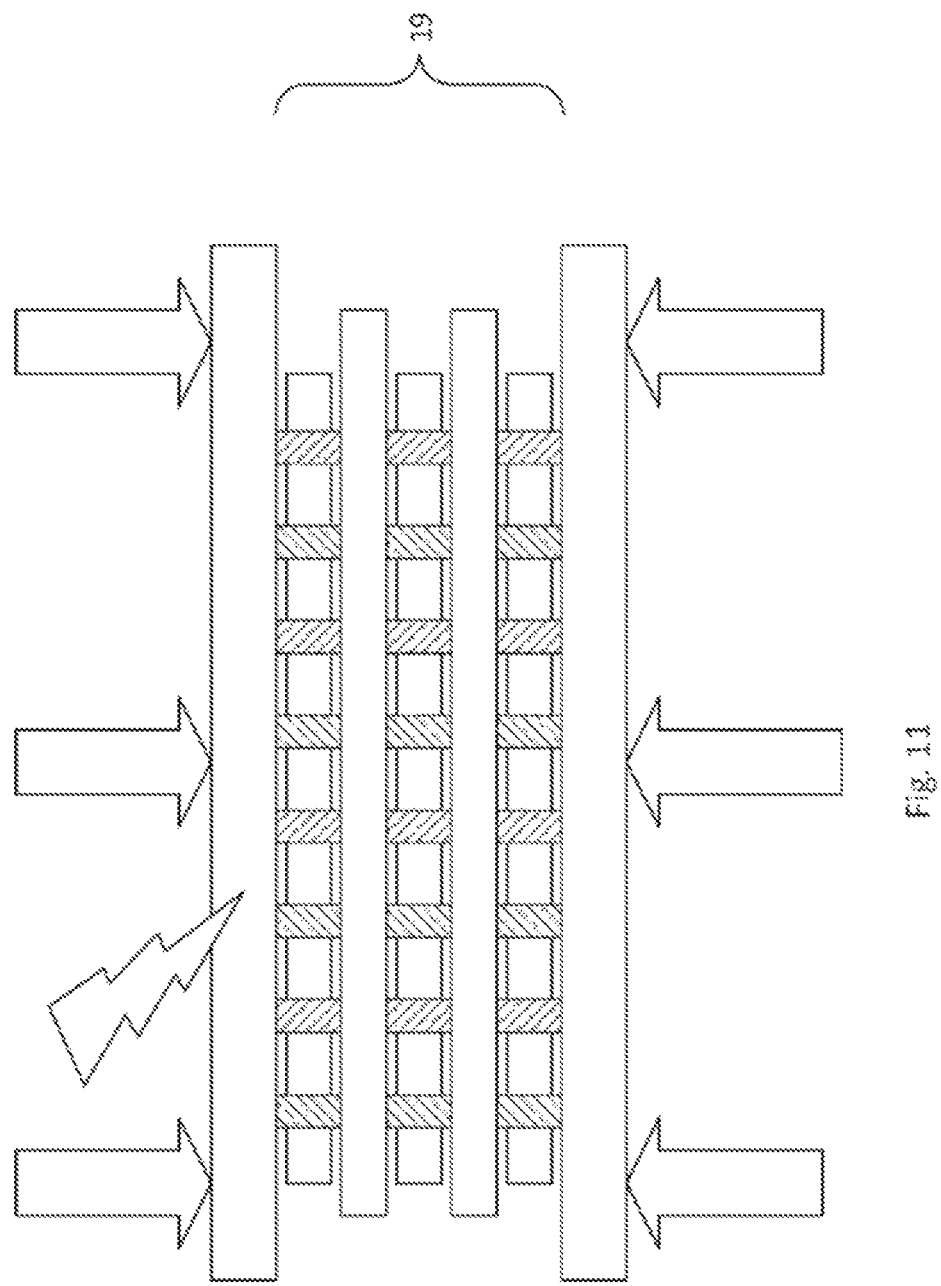

The method will now be illustrated in more detail with reference to schematic drawings. For this purpose, the figures show:

FIG. 1: provision of a substrate;
FIGS. 2a to 2f: provision of active material and pressing the active material to form green bodies;
FIG. 3; inserting the green bodies into the substrate;
FIG. 4: arranging the substrate between two electrodes;
FIG. 5; contacting the end sides of the green bodies with the electrodes;
FIG. 6: exposing the green bodies to electric power and pressing force for the purpose of sintering the green bodies to form thermolegs;
FIG. 7: levelling the substrate and the thermolegs by approaching the electrodes;
FIG. 8: semifinished version;
FIG. 9: thermoelectric component;
FIG. 10: variant: arrangement in stack form of a plurality of substrates between two electrodes using separation plates;
FIG. 11; sintering the stack.

First a substrate 1 is provided. Substrate 1 is a in the planar board made of Pamitherm®. This is a thermally and electrically insulating laminate which is made up of silicone-bound muscovites. The surface size and shape depends on the purpose of use of the later TEG. For example, rectangular boards of size 52 mm×52 mm can be used. The material thickness of the Pamitherm® board is 2 mm. The size ratios in the drawings are not to scale.

Substrate 1 is provided with a multiplicity of through-holes 2 which extend through the substrate perpendicularly to the plane of the substrate 1. Since Pamitherm® boards are delivered blank, the through-holes 2 must be drilled through them. This is formed using a carbide drill. The through-holes have, correspondingly, a circular cross section of 4.07 mm diameter. Nonetheless, other cross section shapes can be provided for the through-holes, such as, for instance hexagonal, in order to increase the packing density. The median packing density for circular holes of 4.07 mm diameter is between two and three through-holes per square centimetre of substrate surface for a land width of 2 mm. In the figures, for simplicity, eight through-holes 2 are shown.

FIGS. 2a to 2f show, stepwise, the cyclical sequence of production of a green body 3 on a tableting press 4. The tableting press is shown simplified as the eccentric type.

For producing the green bodies 3, first a pulverulent thermoelectric active material 5 is provided. This is a bismuth telluride powder having a particle size $d_{50}$ of about 8 μm. The powder is provided in a charging hopper 6 of the tableting press 4; cf. FIG. 2a.

The tableting press 4 meters a preset amount of about 200 mg of the bismuth telluride powder 5 into a mould 7; cf. FIG. 2b.

The mould 7 is part of the tableting press 4 and is usually called a "matrix" by the manufacturers of tableting presses. This expression is intentionally not used here, since some manufacturers of thermoelectric generators call the part of a TEG designated here as substrate as matrix. In the terminology used here, the expression "mould" is always a the part of the tableting press and "substrate" is always a part of the TEG.

The mould 7 is closed at the bottom by a bottom punch 9. The mould 7 is circular-cylindrical having a diameter roughly corresponding to the diameter of the through-holes 2. The length of the green bodies varies between 2.2 mm and 2.6 mm. This therefore corresponds to between 110% to 135% of the substrate thickness. The green bodies therefore have an axial oversize in comparison with the substrate. Optionally, the diameter of the mould 7 can be slightly larger than that of the through-holes 2 in order to produce green bodies having a radial oversize.

After the mould is charged with active material, the charging hopper 6 is put to one side; cf. FIG. 2c.

Figure 2F:
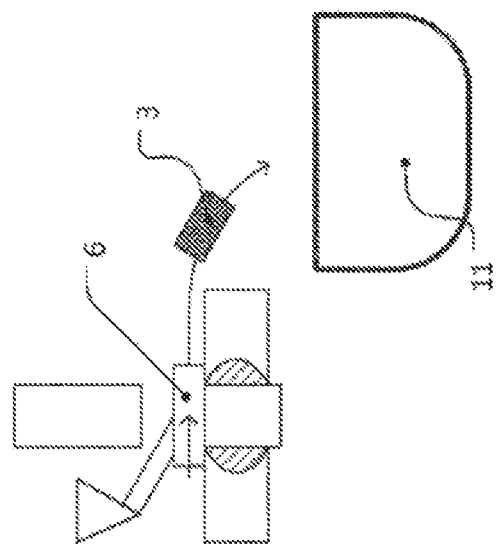
Figure 2E:
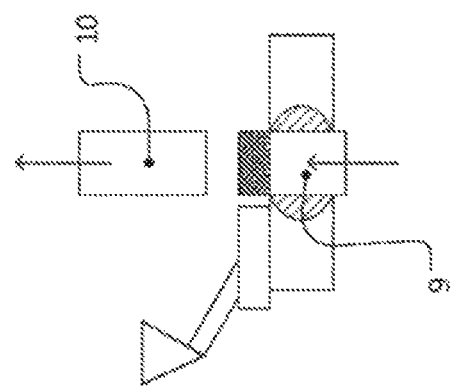
Figure 2D:
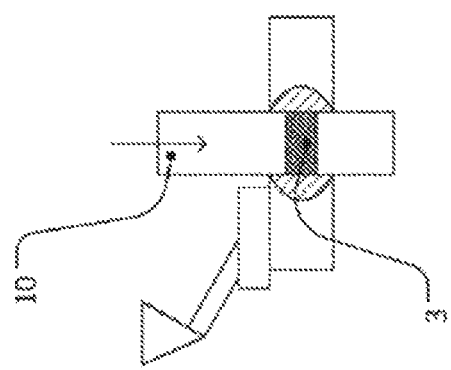

A linearly conducted top punch 10 compacts the powder 5 within the mould 7 to form a circular cylindrical green body 3 (FIG. 2d). The punch force is about 8.5 kN. A pressure of 676 MPa results therefrom within the mould.

The top stamp 10 then reverses. The bottom stamp 9 follows it and in doing forces the green body 3 out of the mould 7 (FIG. 2e).

Finally, the charging hopper 6 travels back into its previous position over the mould and in so doing ejects the green body 3 out of the tableting press 4. The ejected green body 3 is collected in a collecting vessel 11 randomly (FIG. 2f). The bottom punch 9 is moved back down, and so the machine comes back into the starting position shown in FIG. 2a. The charging hopper 6 is again filled with active material 5.

The steps 2a to 2f are repeated on the tableting press 4 at high speed, and so a multiplicity of green bodies can be produced successively. Since the same mould 7 is used each time and the powder can be metered exactly, the green bodies are of constant quality with respect to dimensional stability, density and surface quality. Any faulty pressings are eliminated.

In order to increase the production rate, instead of the eccentric press shown schematically, a rotary press can be used. A rotary press has a multiplicity of top punches, bottom punches and moulds that are arranged in a circular shape around a rotating runner. The top and bottom punches are conducted along a stationary link in order to generate the axial lifting movement of the punches relative to the mould. The pressing forces are applied to the punches by press rolls. Such rotary presses are used in the industrial production of pharmaceutical tablets and are optimized for high throughput speed.

Since the two legs of a thermocouple should have Seebeck coefficients as different as possible, in order to generate a high thermoelectric voltage, two different types of thermoelectric active materials are pressed, namely one n-doped bismuth telluride and one p-doped. Therefore, two different types of green bodies are produced on the same press one after the other, once those made from n-doped active material and once made of p-doped active material. In order that residues of the n-doped active material are not found in the p-doped green bodies, the machine must be cleaned thoroughly between times. In order to avoid this, the p- and n-doped active materials can also be processed on separate machines.

FIG. 3 shows two collecting vessels 11p and 11n which are each charged with a multiplicity of p-doped green bodies 3p and n-doped green bodies 3n, respectively. The green bodies 3n, 3p are situated as single types in the respective collecting vessels 11n, 11p, but are geometrically unsorted.

The green bodies 3n, 3p are withdrawn from the respective collecting vessels 11p, 11n and inserted individually into the through-holes 2 of the substrate 1, in such a manner that the green bodies extend axially through the through-holes and thereby perpendicular to the substrate plane. A pharmaceutical automatic placement machine is used therefor (which is not shown). Alternatively, the green bodies 3n, 3p can be inserted by hand into the substrate 1. p- and n-doped green bodies 3p, 3n are arranged alternately next to one another. Each adjacent p- and n-doped green body later form a thermocouple. It is unimportant whether first all green bodies of one type are inserted and thereafter the other type, or alternately or in series, or in any other desired pattern.

Then, the substrate 1 having the inserted green bodies 3 is arranged between two substantially planar electrodes 12a, 12b; cf. FIG. 4. It is of importance that the substrate 1, the first electrode 12a and the second electrode 12b are each orientated in parallel to one another.

In contrast, it is of no importance whether the end faces of the green bodies 3 used lie in a shared plane. As can be seen from FIG. 4, the green bodies are introduced into the substrate 1 with non-uniform axial offset, for which reason the end sides do not lie in one plane. The reason for this is that the automatic placement machine does not operate so exactly, but in return operates rapidly.

According to the invention, the end sides of the green bodies are brought into one plane using the electrodes, For this purpose the two electrodes 12a, 12b are each moved toward one another along the path Δx, while retaining their parallelity. In this case the planar electrodes contact the end sides of the green bodies and align them in the plane of the respective electrode 12a, 12b contacting the end side. It may be seen in FIG. 5 that the green bodies 3n, 3p now all lie in one plane.

Since the end sides of all green bodies 3n, 3p are situated directly on the electrodes 12a, 12b, not only an electric circuit, but also a mechanical pressing force can be closed via the green bodies between the electrodes.

This is the case in FIG. 6, Both electrodes are each exposed to a force F acting in the direction of the substrate 1 orientated axially to the green bodies, This is dimensioned taking into account the contacted end surfaces of the green bodies such that a mechanical pressure of 30 MPa acts on the active material. In addition an alternating voltage AC of 50 Hz is applied between the electrodes, the voltage of which is dimensioned such that, taking into account the contacted end surfaces of the green bodies, an alternating current having a current density of 50 kA/m² flows through the green bodies.

Ohmic resistance causes green bodies to heat up to a temperature between 300° C. and 400° C., in the region where the optimum sintering temperature is also situated. Under the action of mechanical force, the individual particles of the green bodies sinter together, and so a solid sintered body results from the pressed powder material. The sintered green bodies are the thermolegs 13.

During the sintering, the green bodies are compacted, and so the thermolegs have a correspondingly smaller volume (sinter shrinkage). To maintain the electrical and mechanical contact between the green bodies 3 and the electrodes 12, despite the progressing sinter shrinkage, the two electrodes 12a, 12b are each repositioned following the sinter shrinkage in the direction of the substrate 1, each along the pathway Δy while retaining their parallelity (FIG. 7).

The length of the green bodies 3 is selected, taking into account the sinter shrinkage, in such a manner that the thermolegs 13n, 13p after sintering finish flush with the substrate 1; cf. FIG. 8. In the case of the material combination Pamitherm®/bismuth telluride, the oversize of the green bodies should be about 15% of the substrate thickness, in order that during sintering the green bodies shrink to the substrate thickness. In this manner, a later separate levelling of the workpiece is unnecessary. Furthermore, restriction of the pathway Δy prevents the substrate 1 from being wedged and compressed between the two electrodes 12a, 12b. Any elasticity of the substrate material could otherwise cause a return of the substrate via the end faces of the thermolegs, which makes the later contactability of the thermolegs more difficult. Rather, a semifinished version 14 of the later thermoelectric component is obtained directly from the sintering process which is planar on both sides and in which the end faces of the thermolegs 13 are flush with the surface of the substrate on both sides. The semifinished version 14 is shown in FIG. 8.

In order to fabricate a thermoelectric component 15 from the semifinished version, it is necessary to combine the thermolegs in pairs to form thermocouples 16, In each case one thermoleg 13p made of p-doped active material and one thermoleg 13n made of n-doped active material form a thermocouple 16. Furthermore, the thermocouples 16 must be connected in series. This is achieved using contact bridges 17 that are good electrical and thermal conductors which are soldered onto the end faces of thermocouples 13n, 13p on alternating sides (FIG. 9).

The resultant thermoelectric component 15 is thus already functional: when the substrate 1 is placed between a heat source and a heat sink, in such a manner that heat flows via the contact bridges and through the thermolegs 13 from one side of the substrate to the other, a thermoelectric voltage can be tapped on the contract bridges 17+, 17− that are free on one side. The thermoelectric component 15 then operates as a thermoelectric generator. Vice versa, by applying an electric voltage to the contact bridges 17+, 17− free on one side, a heat pressing force from the cold side of the substrate to the warm side can be induced (Peltier element). In order than an electrical short circuit is not formed, the total thermoelectric component 15 should be further provided with a thermally conducting and electrically insulating sheath which also protects it from mechanical damage (this is not shown).

In FIG. 10, a particularly rational method variant is shown in which a plurality of substrates 1i, 1ii and 1iii having inserted green bodies are sintered simultaneously. For this purpose, the three substrates 1i, 1ii and 1iii are arranged between the two electrodes 12a and 12b. A planar separation plate 18a, 18b is placed in each case between the internally lying substrate 1ii and the two externally lying substrates 1i and 1iii. A slack 19 is formed. The two planar separation plates 18a, 18b consist of graphite, as do the electrodes 12a, 12b. All of the substrates 1i, 1ii and 1iii, both electrodes 12a, 12b and both separation plates 18a, 18b are orientated plane parallel to one another, and form a stack 19.

The stack 19 is sintered in one operational pass and as a result three semifinished versions are produced simultaneously (FIG. 11). The stack 19 is sintered as described for FIG. 6.

A plurality of substrates having inserted green bodies can also be subjected simultaneously to the sintering process without stacking them. For this purpose the substrates are placed between the electrodes lying in one plane next to one another. This saves the separation plates, but requires electrodes that have a larger surface area than a single substrate. This variant of the invention is not illustrated.

A combination of both arrangements is likewise possible.

Independently of the arrangement and number of the substrates between the electrodes, the sintering process can, moreover, be controlled in such a manner that the green bodies are first exposed to a force $F_1$ which is less than a force $R_{cold}$, which corresponds to the breaking load of the electrodes 12a,b or of the separation plates 18a,b in the cold state (room temperature $T_0$). The alternating current voltage is then applied and as a result the green bodies are heated to a temperature $T_{limit}$, which is lower than the sintering temperature $T_{sinter}$ at which, however, the breaking load of the graphite elements is increased to $R_{hot}$. Only after the higher mechanical strength is achieved is the force increased to $F_2$ from which the required mechanical sintering pressure results, After the sintering pressure is achieved, the temperature is increased to the required sintering temperature $T_{sinter}$ and the sintering operation is performed under these conditions, The following two relationships therefore apply:

$$F_1 < R_{cold} < F_2 < R_{hot} \tag{1}$$

$$T_0 < T_{limit} < T_{sinter} \tag{2}$$

This procedure may be employed when sintering individual substrates (FIG. 6), a plurality of substrates next to one another without separation plates, or else stacks having separation plates (FIG. 11). What is important is always the lowest breakage load of the graphite elements that are used.

LIST OF REFERENCE SYMBOLS 1 substrate
1i first substrate (external)
1ii second substrate (internal)
1iii third substrate (external)
2 through-holes
3 green body
3n n-doped green body
3p p-doped green body
4 tableting press
5 thermoelectric active material in powder form ($Bi_2Te_3$)
6 charging hopper
7 mould
8 not assigned
9 bottom punch
10 top punch
11 collecting vessel (in general)
11n collecting vessel for n-doped green bodies
11p collecting vessel for p-doped green bodies
12a first electrode
12b second electrode
Δx path of the electrodes on contacting
Δy path of the electrodes during sintering F force
AC alternating current
13 thermoleg
13n thermoleg made of n-doped active material
13p thermoleg made of p-doped active material
14 semifinished version
15 thermoelectric component
16 thermocouple
17 contact bridge
17⁺ contact bridge free on one side
17⁻ contact bridge free on one side
18a first separation plate
18b second separation plate
19 stack

The invention claimed is:

1. A method for production of a semifinished version of a thermoelectric component, the method comprising:
    a) providing a substantially planar substrate comprising an electrically and thermally insulating substrate material, through which through-holes extend oriented substantially perpendicularly to the substrate plane;
    b) providing a pulverulent thermoelectrically active material;
    c) pressing the active material to form green bodies, wherein the pressing proceeds in a mould different from the substrate;
    d) inserting the green bodies into the through-holes of the substrate in such a manner that, within each through-hole, along the axis thereof, one green body extends through the substrate;
    e) arranging the substrate with the green bodies inserted therein between two substantially planar electrodes, in such a manner that both electrodes and the substrate are substantially orientated parallel to one another;
    f) contacting face ends of the green bodies with the electrodes in such a manner that a connection is provided between the two electrodes via the green bodies, which connection transmits not only an electrical current but also a mechanical pressing force;
    g) exposing the green bodies to an electric current flowing between the electrodes in such a manner that heat is evoked within the thermoelectric active material;
    h) exposing the green bodies to a pressure force acting between the electrodes in such a manner that the thermoelectric active material comes under pressure;
    i) sintering the green bodies to form thermolegs, with the action of pressure and heat; and
    k) levelling the substrate and the thermolegs accommodated therein by bringing them closer to the electrodes while maintaining the parallelity thereof, in such a manner that each end face of said thermolegs finish flush with a planar surface of said substantially planar substrate,
    wherein any axial offset of the green bodies in the substrate and also any sinter shrinkage are compensated for by selection of a size of said green bodies.

2. The method according to claim 1, wherein
a plurality of substrates with inserted green bodies are combined to form a stack,
    wherein the substrates extend within the stack in parallel to one another and in each case a substantially planar separation plate is laid between two substrates that are adjacent within the stack, which separation plate extends in parallel to the substrates and which produces an electrically conductive and force-transmitting connection between the green bodies of the adjacent substrates, and
    wherein the entire stack is arranged between the two electrodes.

3. The method according to claim 2,
wherein the electrodes comprise graphite and/or the separation plate comprises graphite,
    wherein the green bodies, for contacting, are exposed to a first pressing force in f), and,
    then the green bodies under the action of the first pressing force in f) are exposed to electric current until the electrodes and/or the separation plate have achieved a temperature at which the electrodes and/or the separation plate have an increased load-bearing capacity which is above the first pressing force in f), and
    wherein the green bodies are then exposed to a second pressing force in h), which is above the first pressing force in f) and below the increased load-bearing capacity.

4. The method according to claim 1, wherein
a plurality of substrates having inserted green bodies are arranged individually or stacked in a plane between the two electrodes.

5. The method according to claim 1, wherein,
in the pressing of the pulverulent active material, the active material is compacted to a first compressed density which corresponds to between 75% and 85% of the true density of the active material.

6. The method according to claim 1, wherein
the green bodies are sintered to form the thermolegs at a temperature which corresponds to between 50% to 70% of the melting temperature of the active material.

7. The method according to claim 1, wherein,
during the exposure of the green bodies to the pressing force acting between the electrodes, the green bodies are compacted to a compressed density which corresponds to between 90% and 97% of the true density of the active material.

8. The method according to claim 1, wherein
the green bodies have a circular cylindrical shape.

9. The method according to claim 8, wherein
the green bodies each have a chamfer at the end face.

10. The method according to claim 8, wherein
the green bodies have a mean roughness value $R_a$ between 12 μm and 24 μm, as specified in DIN 4766 T2, on the lateral surface thereof.

11. The method according to claim 1, further comprising:
clamping the green bodies into the through-holes by inserting conical green bodies, by inserting into tapered through-holes or by inserting a radial oversize of the green bodies compared with the through-holes.

12. The method according to claim 1, wherein
the pulverulent thermoelectric active material is prepared dry in a tableting press,
    wherein the mould in which the active material is pressed to form green bodies is arranged within the tableting press, and
    wherein the green bodies are ejected randomly from the tableting press.

13. The method according to claim 12, wherein
the green bodies, manually or by a conveying appliance, are taken up, isolated, and inserted in an ordered manner into the through-holes of the substrate.

14. The method according to claim 1, wherein
the substrate material is a composite material comprising an inorganic raw material and a binder.

15. The method according to claim 14, wherein
the composite material is made up as a laminate,
wherein the inorganic raw material is at least one material selected from the group consisting of mica, perlite, phlogopite, and muscovite, and
wherein the binder is silicone or a silicone resin or an epoxy resin.

16. A method for production of a thermoelectric component, comprising:
producing a semifinished version of a thermoelectric component according to claim 1 and combining thermolegs in pairs to form thermocouples.

* * * * *